United States Patent [19]

Katsuda et al.

[11] Patent Number: 5,998,321
[45] Date of Patent: *Dec. 7, 1999

[54] ALUMINUM NITRIDE SINTERED BODY, ELECTRONIC FUNCTIONAL MATERIAL, AND ELECTROSTATIC CHUCK

[75] Inventors: Yuji Katsuda, Tsushima; Kiyoshi Araki, Nagoya; Tsuneaki Ohashi, Ogaki, all of Japan

[73] Assignee: NGK Insulators, Ltd., Japan

[ * ] Notice: This patent is subject to a terminal disclaimer.

[21] Appl. No.: 09/152,296

[22] Filed: Sep. 14, 1998

[30] Foreign Application Priority Data

Sep. 29, 1997 [JP] Japan ................................ 9-263329

[51] Int. Cl.$^6$ .................................................. C04B 35/581
[52] U.S. Cl. .......................... 501/98.4; 501/152; 279/128
[58] Field of Search ...................... 501/98.4, 153, 501/152; 279/128; 29/825; 428/698

[56] References Cited

U.S. PATENT DOCUMENTS

| | | | |
|---|---|---|---|
| 4,711,861 | 12/1987 | Sawamura et al. | 501/98.4 |
| 5,085,923 | 2/1992 | Yamakawa et al. | 501/98.4 |
| 5,393,715 | 2/1995 | Nakahata et al. | 501/98.4 |
| 5,413,360 | 5/1995 | Atari et al. | 279/128 |

FOREIGN PATENT DOCUMENTS 0 771 772 A3  5/1997  European Pat. Off. .

*Primary Examiner*—Michael Marcheschi
*Attorney, Agent, or Firm*—Parkhurst & Wendel, L.L.P.

[57] ABSTRACT

This invention relates to an aluminum nitride sintered body comprising aluminum nitride crystal grains, in which the grains have a given content of a rare earth element (a conversion content as an oxide thereof), a given average grain size, and a given spin amount per unit mg of aluminum obtained from a spectrum as measured by an electron spin resonance method. The aluminum nitride sintered body is used in an electronic functional material and an electrostatic chuck.

9 Claims, 1 Drawing Sheet atent 5,998,321

ALUMINUM NITRIDE SINTERED BODY, ELECTRONIC FUNCTIONAL MATERIAL, AND ELECTROSTATIC CHUCK

BACKGROUND OF THE INVENTION

1. Field of the Invention

This invention relates to an aluminum nitride sintered body having a relatively small temperature dependence of volume resistivity as well as an electronic functional material or an electrostatic chuck employing the same, respectively.

2. Description of Related Art

At present, an electrostatic chuck is used for attracting and holding a semiconductor wafer in film forming processes for the semiconductor wafer such as transportation, light exposure, chemical vapor deposition (CVD), sputtering and the like, or steps of micromachining, cleaning, etching, dicing and the like. As a substrate for the electrostatic chuck, dense ceramics have been used. Particularly, a halogenous corrosive gas such as $ClF_3$ or the like is frequently used as an etching gas or a cleaning gas in an apparatus for the manufacture of the semiconductor. A dense aluminum nitride has a high corrosion resistance against the above halogenous corrosive gas. And the aluminum nitride is also known to be a high thermal conductive material and to be high in the thermal shock resistance. Therefore, it is considered that it is preferable to make the substrate of the electrostatic chuck for the semiconductor manufacturing apparatus from an aluminum nitride sintered body.

In general, when the aluminum nitride is used as a substrate material for the electrostatic chuck, it is preferable that a volume resistivity is within a range of $10^8$–$10^{13}$ $\Omega \cdot$cm at operating temperatures. However, the volume resistivity of aluminum nitride extremely decreases, for example, from $10^{16}$ $\Omega \cdot$cm to not more than $10^7$ $\Omega \cdot$cm over a range of room temperature to 600° C., so that it is impossible to develop the stable operation as the electrostatic chuck in such a wide temperature range. Therefore, a service temperature of the electrostatic chuck is limited to a range of, for example, 200–400° C.

SUMMARY OF THE INVENTION

It is, therefore, an object of the invention to provide a novel aluminum nitride sintered body having a small change of volume resistivity over a wider temperature range as compared with the conventional one.

It is another object of the invention to provide an aluminum nitride sintered body having a low temperature dependence of volume resistivity as mentioned above, and having a composition that a content of metal impurities is small and a contamination in the semiconductor is not caused.

According to the invention, there is the provision of an aluminum nitride sintered body comprising aluminum nitride crystal grains, in which a content of a rare earth element (a conversion content as an oxide thereof) is within a range of 0.05–0.5% by weight, and an average grain size of the aluminum nitride crystal grains is not more than 3 μm, a spin amount per unit mg of aluminum obtained from a spectrum as measured by an electron spin resonance method is not more than $5 \times 10^{12}$ spins/mg.

BRIEF DESCRIPTION OF THE DRAWING

The invention will be described with reference to the accompanying drawing, wherein.

DESCRIPTION OF THE PREFERRED EMBODIMENTS

Figure 1:
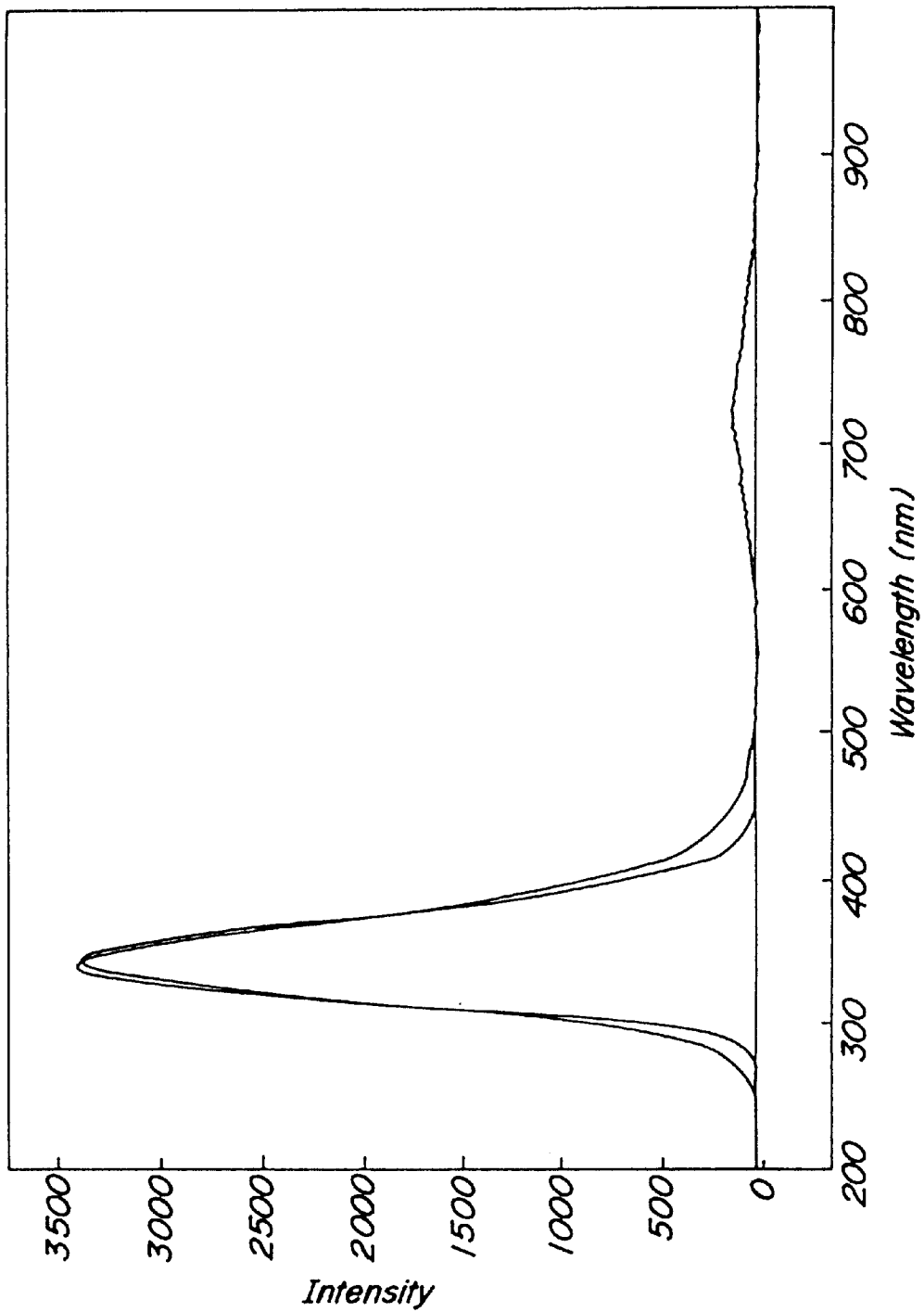
FIG. 1 is a graph showing a cathode luminescence spectrum measured on the sintered body of Example 4 according to the invention.

The inventors have tried to use a raw material having such a specific composition that a content of a rare earth element (a conversion content as an oxide thereof) is not less than of 0.05% by weight but not more than 0.5% by weight and then sinter it under a condition sufficient to make large a relative density at a low temperature range as far as possible by a pressing method such as a hot pressing method or the like, and confirmed what change appears on the resulting sintered body. As a result, it is now possible to obtain an aluminum nitride sintered body having an extremely small temperature dependence of volume resistivity of the sintered body and the extremely small change thereof particularly in a temperature range of 100–500° C. or the like as compared with the conventional one by controlling the spin amount per unit mg of aluminum obtained from a spectrum as measured by an electron spin resonance method to not more than $5 \times 10^{12}$ spins/mg under a condition that an average grain size of aluminum nitride crystal grains is not more than 3 μm.

Such an aluminum nitride sintered body can be manufactured by a hot press sintering method even when an amount of metal impurities other than the rare earth element is restricted to a very low value, so that the contamination in the semiconductors can be extremely controlled.

Although the reasons for obtaining the above notable function and effect are not clear, it is basically thought that the resistance of the aluminum nitride sintered body is calculated as a resistance of a circuit formed by connecting resistors of aluminum nitride crystal grains with grain boundary resistors in series and parallel. The inventors have tried to use high-purity aluminum nitride grains and add a small amount of a rare earth element thereto to accelerate densification of the sintered body by a method using a high pressure such as hot press method or the like.

In this case, when the amount of the rare earth element compounded is more than 0.5% by weight, oxygen existing in the grains of the starting material diffuses towards the outside of the grains during the firing. On the contrary, according to the invention, the amount of the rare earth element compound is adjusted to a slight level and a high pressure is applied during the sintering, whereby oxygen is retained in aluminum nitride crystal grains at a state of solid solution. This oxygen existing in the crystal grains replaces a nitrogen atom in AlN to form a donor level in a band gap and bring about an improvement of an electron conductivity in the grains. That is, according to the invention, oxygen is retained as a donor for decreasing an inner resistance of each crystal grain by adjusting the amount of the rare earth element compound and increasing the pressure during the sintering to control the amount of oxygen existing in the grains after the sintering under pressure.

From this point of view, it is preferable that the content of the rare earth element is not more than 0.5% by weight, and more preferably not more than 0.4% by weight. And also, in order to obtain a homogeneous sintered body, the content of the rare earth element is not less than 0.05% by weight.

The lower limit of average grain size of aluminum nitride crystal grains is not particularly limited, but it is generally preferable to be not less than 1.0 μm. The average grain size is preferable to be 2.2–2.9 μm.

As the rare earth element, lanthanum, praseodymium, neodymium, gadolinium, and ytterbium are preferable, and more preferably yttrium.

In order to obtain the aluminum nitride sintered body according to the invention, it is required to adopt a press sintering method such as a hot press method and a hot isostatic press method. The aluminum nitride sintered body can be densified by this method without requiring much sintering aid.

At the same time, the crystal grain growth is stopped at such a level that the average grain size of the aluminum nitride crystal grain is not more than 3 μm, whereby the aluminum nitride sintered body according to the invention is obtained.

In order to study defect structures in an inside of the crystalline phase and at the grain boundary thereof in the aluminum nitride sintered body according to the invention, the inventors have taken a spectrum as measured by an electron spin resonance method (ESR method) with respect to each sample thereof. The principle of ESR method will be explained briefly as mentioned below. An energy level of an unpaired electron is split under a magnetic field due to the Zeeman's effect. To this energy level sensitively reacts an interaction between an electron orbit movement and a nuclear magnetic efficiency of an atom in the vicinity thereof. The split energy level is measured by the ESR method, whereby it is possible to obtain information about atoms, chemical bond and the like in the vicinity of an atom having the unpaired electron.

It is required that the spin amount per unit mg of aluminum obtained from the spectrum as measured by the electron spin resonance method is not more than $5 \times 10^{12}$ spins/mg. Preferably, the spin amount is not less than $1 \times 10^{12}$ spins/mg.

Moreover, the measurement of the spin amount is carried out according to a method described by Hiroaki Ohya and Jun Yamauchi: "Electron Spin Resonance" (published by Kodansha Co., Ltd.). The inventors quantify a single ultra-fine line of $Mn^{2+}/MgO$ by using a solution of TEMPOL (4-hydroxy-2,2,6,6-tetramethylpiperidine-1-oxyl) having a known spin amount, and calculate a spin amount from an area ratio of peaks by comparing spin amounts through the quantified line.

In the aluminum nitride, g-value of the unpaired electron of aluminum changes in accordance with a crystal field including the unpaired electron. This g-value is theoretically 2.0000 in a free electron, and 2.002316 after a relativistic correction. Since Al atom and N atom in the aluminum nitride crystalline phase have a four coordination wurtzite structure, $sp^3$ hybridized orbit is formed by one aluminum atom and three nitrogen atoms. It is possible to know, from the g-value of each sample, what crystalline coordination that unpaired electron in the lattice defect exist in or what kind of elements exist around the unpaired electron.

In the aluminum nitride sintered body according to the invention, the g-value is preferable to be not less than 2.0001 but not more than 2.0009. As a result of the inventors' discovery, if the pressure during the sintering is the same, as a maximum temperature in the firing increases, the g-value tends to decrease and the volume resistivity at room temperature tends to diminish. However, it is required to restrict the g-value to the above range in order to decrease the change of volume resistivity in a temperature range as wide as possible, particularly over a wide temperature range of 100–500° C. It is considered that such a change of the g-value is caused by an influence of oxygen existing in the aluminum nitride crystal grains.

When the aluminum nitride sintered body according to the invention is used for a semiconductor process, it is unfavorable to add an alkaline metal or a transition metal which is considered to be an impurity in the above process to the sintered body. In the invention, therefore, it is favorable to use a high-purity raw material, and concretely, the amount of metal impurities other than the rare earth element is preferably not more than 500 ppm. More preferably, the amount of the metal impurity other than the rare earth element is not more than 100 ppm, which includes 0 ppm or not more than the limitation of detection.

And it is also preferable that a difference between a total oxygen content and a conversion oxygen content of the rare earth element converted to an oxide thereof in the aluminum nitride sintered body is not more than 1.0% by weight.

The inventors have estimated a state of electrons in a band gap exerting upon electric properties of the aluminum nitride sintered body and measured a cathode luminescence spectrum in order to further clarify the features of the sintered body according to the invention.

In general, the cathode luminescence is a wave reflected from a sample when an electron beam is irradiated to the sample. If an electron is excited from a valence band to a conduction band, a hole is formed in the valence band. Then, a radiation having a wavelength corresponding to a band gap between the conduction band and the valence band is produced when the excited electron transits from the condition band to the valence band and is recombined with the hole in the valence band. In addition, if a local electron level other than the conduction band is generated by actions of defects and impurities included in the crystal, a radiation is produced when an excited electron transits from the local electron level to the valence band and is recombined with the hole. Therefore, it is possible to obtain information about an energy band structure, a crystallizability, and defects and impurities included in the crystal from the cathode luminescence spectrum.

When the cathode luminescence spectrum is measured with respect to the sintered body according to the invention, a strong main peak exists within a wavelength range of 350–370 nm as shown in FIG. 1. And a weak peak regarded as a double multiple wave of the main peak is also detected within a wavelength range of 650–750 nm.

For the comparison, the inventors provide a high density sintered body prepared by adding aluminum nitride powder with 5% by weight of yttria powder and firing it, and measure a cathode luminescence spectrum thereof. As a result, weak peaks are observed at wavelengths of about 340 nm, 500 nm and 600 nm, respectively.

Such a difference in the emission wavelengths indicates a difference in the kind of emissions (electron levels in the band gap). A difference in the emission intensities indicates a difference in the electron densities based on the impurities. In case of the sintered body according to the invention, a very strong and sharp peak is observed within a wavelength range of 350–370 nm, which shows the existence of a very strong new electron level and means that the electron density based on a specified impurity is high.

In the production of the sintered body according to the invention, the rare earth element may be added to the raw material powder in various forms. For example, powder of the rare earth element itself or a compound thereof can be added to the aluminum nitride raw material powder.

In general, an oxide of rare earth element is most available. However, in case of using the oxide of the rare earth element, since the amount of the rare earth element added is slight in the invention, if the dispersion of the rare earth element oxide is insufficient, it is difficult to spread the rare earth element over the whole of the sintered body, which results in the occurrence of the scattering with respect to various properties such as volume resistivity and the like in any portion of the sintered body.

In the invention, therefore, a compound of the rare earth element such as nitrate, sulfate, alkoxide or the like is dissolved in a proper solvent to obtain a solution containing such a compound, which is added to the aluminum nitride raw material powder. In this case, even if the amount of the rare earth element added is slight, the rare earth element is uniformly dispersed into any portion of the sintered body. And also, the rare earth element is probably dispersed onto the surface of each grain as a very thin layer, so that the compound of the rare earth element having a high resistivity hardly segregate. If the dispersion is insufficient, there may locally be precipitated the rare earth element containing crystal.

In case of using a dry press shaping process, a spray dry process can be proposed as a process for drying the raw material powder. This is particularly usable as an instant drying process for the compound of the rare earth element as a trace additive.

Alternatively, a tape shaping process may be used. In this case, the solution obtained by dissolving the compound of the rare earth element such as nitrate, sulfate and alkoxide or the like in the solvent may be added as an additive in a usual tape shaping step. Since the addition amount is slight, there is no influence upon the shapability and degreasability.

In the preparation step, the aluminum nitride raw material powder is dispersed into the solvent, to which may be added the compound of the rare earth element in the form of oxide powder or solution as mentioned above. The mixing may be conducted by simple stirring, but when it is required to pulverize aggregates in the raw material powder, a mixing and pulverizing machine such as pot mill, trommel, attrition mill or the like may be used. In the case of using an additive soluble in the solvent for pulverization, the time of conducting the mixing and pulverizing step may be a shortest time required for the pulverization of the powder. Moreover, a binder such as polyvinyl alcohol or the like may be added.

A spray dry process is preferable for the step of drying the solvent for pulverization. It is also favorable to adjust a grain size of a dried powder through a sieve after the conduction of a vacuum drying process.

In the powder shaping step, a mold pressing process may be employed for the manufacture of a disc-shaped body. In this case, a shaping pressure is preferable to be not less than 100 kgf/cm$^2$, but is not particularly limited if it is possible to maintain the shaping. And the shaping material may be also filled in a hot press die in the form of powder.

When a binder is added to the shaped body, the degreasing may be carried out at a temperature of 200–800° C. in an oxidizing atmosphere prior to the firing.

When an additive containing the rare earth element is added in the form of nitrate, sulfate or carbonate, the powdery raw material or the powder shaped body may be subjected to denitrification, desulfurization or decarboxylation treatment prior to the Erring. Such a degassing step may be carried out by heating the above powdery raw material or shaped body in an oxidizing atmosphere likewise the degreasing step. In this case, it is required to care about the damage of a furnace due to the resulting NOx gas, SOx gas or the like.

Moreover, the degassing may be carried out during the firing without conducting separately the degassing step such as denitrification, desulfurization, decarboxylation or the like.

Then, the shaped body is fired by a hot press method. The pressure in the hot pressing is required to be not less than 50 kgf/cm$^2$ and it is preferably not less than 100 kgf/cm$^2$. The upper limit is not particularly restricted, but is practically not more than 1000 kgf/cm$^2$ in order to prevent the damage of the furnace tool such as a mold or the like.

It is possible to raise the pressure up to a maximum pressure at once. However, it is particularly preferable to raise the pressure stepwise in accordance with the rise in the temperature in order to improve the dimensional accuracy of the sintered body.

When the disc-shaped body is fired by the hot press method, it is preferable to accommodate the shaped body in a sleeve having an inner diameter slightly larger than an outer diameter of the shaped body.

When the degassing is required at a time of raising the temperature, it is preferable to promote exhalation of gas by heating under vacuum over a temperature range of from room temperature to 1,600° C.

Furthermore, it is preferable to raise the temperature at a temperature rising rate of not less than 50° C./hour but not more than 1,500° C./hour up to a maximum temperature in the firing. The maximum temperature is preferable to be 1,650–1,850° C.

In the hot press method, there is now proposed a method of applying boron nitride as a parting agent between the shaped body or raw material powder and a carbon jig. In the invention, however, the use of the parting agent is unfavorable because there is a fear of incorporating boron into the sintered body.

A metal can be embedded in the sintered body according to the invention, which is particularly suitable as an electrode embedded article used under an environment hating impurities. As such an application, mention may be made of a ceramic electrostatic chuck, a ceramic heater, a high frequency electrode apparatus and the like. Preferably, it can be used in the electrostatic chuck.

When the sintered body according to the invention is used as an electrostatic chuck for attracting a semiconductor wafer, the attracting property as the electrostatic chuck can considerably be improved over a temperature range of about room temperature to 600° C., preferably about 100° C. to 500° C. The response for detaching the wafer is good because electric charge is lost at a sufficient rate immediately after turning off the voltage.

A metal member embedded in the aluminum nitride sintered body is preferable to be a plate-type metal bulk material. When the metal embedded article is an electrostatic chuck, the metal member is a plate-type electrode made from the metal bulk material.

Since the metal member is fired together with the aluminum nitride powder, it is preferable to be made of a metal having a high melting point. As such a high melting point metal, mention may be made of tantalum, tungsten, molybdenum, platinum, rhenium, hafnium, and an alloy thereof. From a viewpoint of the prevention of semiconductors from contamination, tantalum, tungsten, molybdenum, platinum and alloys thereof are more preferable.

When the invention is applied to the electrostatic chuck, electrodes of the electrostatic chuck may be used as an electrode for generating plasma by connecting a high frequency power source to the electrodes and supplying a high frequency voltage together with a DC voltage thereto.

Further, the sintered body according to the invention can be used as a substrate for the semiconductor manufacturing apparatus such as a susceptor for arranging a semiconductor wafer, a dummy wafer, a shadow ring, a tube for generating a high frequency plasma, a dome for generating a high frequency plasma, a high frequency transmitting window, an infrared transmitting window, a lift pin for supporting a semiconductor wafer, a shower plate and the like.

As an electronic functional material capable of using the sintered body according to the invention, there can be mentioned a heating source for induction heating (a heater material). That is, the sintered body according to the invention has a high purity and a high corrosion resistance against plasma, so that it can be utilized as a heating source for induction heating used in a plasma atmosphere.

The invention will be described with respect to the following concrete experimental results.

There are prepared various aluminum nitride sintered bodies in Examples and Comparative Examples shown in Tables 1–4.

As a raw material powder is used aluminum nitride powder obtained by a reducing nitriding method. An additive solution is prepared by dissolving yttrium nitrate in isopropyl alcohol and mixed with the aluminum nitride powder in a pot mill. The mixing ratio of yttrium converted to $Y_2O_3$ is shown in Tables 1 and 3.

A disc-shaped body having a diameter of 200 mm is produced by uniaxially pressing the raw material powder mixture under a pressure of 200 kgf/cm$^2$. The disc-shaped body is placed in a hot press mold and sealed hermetically. The temperature in the mold is raised at a temperature rising rate of 300° C./hour while the pressure is reduced over a range from room temperature to 1,000° C. After the temperature reaches 1,000° C., the pressure is raised up to 200 kgf/cm$^2$ stepwise while nitrogen gas is introduced at a rate of 2.5 kgf/cm$^2$. A maximum temperature in the firing is changed as shown in Tables 1 and 3. After the maximum temperature is held for a retention time as shown in Tables 1 and 3, the shaped body is cooled at a cooling rate of 300° C./hour to 1,000° C. and then cooled spontaneously inside the furnace.

With respect to each of the thus obtained sintered bodies, content of yttrium (Y content), total oxygen content (O content), and difference between total oxygen content and oxygen content converted to $Y_2O_3$ are shown in Tables 2 and 4.

Further, the following measurements are carried out with respect to the sintered body in each Example or Comparative Example.

(Average grain size)

It is determined by taking an electron photomicrograph of the sintered body and calculating an average value of major lengths of grains observed in the electron photomicrograph (Tables 1 and 3).

(ESR spin amount (spins/mg))

It is calculated from a resonance condition formula of ESR as previously mentioned (Tables 1 and 3).

(g-value)

It is measured as previously mentioned.

(Volume resistivity at 100° C. and 500° C., respectively)

It is measured by a method of measuring a volume resistivity of an insulating substance according to JIS C 2141. In each Table, the volume resistivity is represented by using abbreviation. For example, "3.6E+13" means "3.6× 10$^{13}$". Here, the measurement is carried out at an applied electric field strength of 500 V/mm after a silver paste is applied to a semi-circular sample having a diameter of 100 mm and a thickness of 0.8 mm at an area of 3.14 cm$^2$.

(Main peak in cathode luminescence spectrum)

The cathode luminescence is measured as previously mentioned to obtain a position of the main peak (Tables 2 and 4).

(Lightness and Chromaticness)

The lightness is measured according to JIS Z 8721 and the chromaticness is visually observed (Tables 2 and 4).

TABLE 1

|  | Y content as $Y_2O_3$ (wt %) | Maximum temperature in firing (° C.) | Retention time at maximum temperature (hour) | Average grain size (μm) | Spin amount (spin/mg) | g-value | Volume resistivity (Ω · m) at 100° C. | at 500° C. |
| --- | --- | --- | --- | --- | --- | --- | --- | --- |
| Example 1 | 0.06 | 1750 | 4 | 2.2 | 1.8E + 12 | 2.0006 | 3.6E + 13 | 2.1E + 8 |
| Example 2 | 0.1 | 1700 | 4 | 2.1 | 1.0E + 12 | 2.0006 | 6.0E + 13 | 2.5E + 8 |
| Example 3 | 0.1 | 1700 | 8 | 2.7 | 3.0E + 12 | 2.0005 | 1.8E + 13 | 1.1E + 8 |
| Example 4 | 0.1 | 1750 | 4 | 2.4 | 2.2E + 12 | 2.0005 | 2.1E + 13 | 1.2E + 8 |
| Example 5 | 0.1 | 1800 | 1 | 2.7 | 3.5E + 12 | 2.0001 | 7.8E + 12 | 2.7E + 7 |
| Example 6 | 0.3 | 1700 | 4 | 2.3 | 2.0E + 12 | 2.0005 | 2.4E + 13 | 3.0E + 8 |
| Example 7 | 0.3 | 1800 | 1 | 2.8 | 3.9E + 12 | 2.0002 | 7.0E + 12 | 2.1E + 7 |
| Example 8 | 0.5 | 1700 | 4 | 2.6 | 4.2E + 12 | 2.0005 | 1.0E + 13 | 2.2E + 8 |
| Example 9 | 0.5 | 1800 | 1 | 2.9 | 4.4E + 12 | 2.0001 | 5.8E + 12 | 2.3E + 7 |

TABLE 2

|  | Amount of metal impurities (ppm) | Y content (wt %) | O content (wt %) | Difference between total O content and O content as $Y_2O_3$ (wt %) | Relative density (%) | Lightness and chromaticness | Main peak in cathode luminescence spectrum (nm) |
| --- | --- | --- | --- | --- | --- | --- | --- |
| Example 1 | 80 | 0.052 | 0.73 | 0.72 | 99.6 | N4 black | 350–370 |
| Example 2 | 80 | 0.098 | 0.74 | 0.71 | 99.7 | N4 black | 350–370 |
| Example 3 | 70 | 0.097 | 0.71 | 0.68 | 99.7 | N4 black | 350–370 |
| Example 4 | 80 | 0.099 | 0.75 | 0.72 | 99.7 | N4 black | 350–370 |
| Example 5 | 70 | 0.085 | 0.72 | 0.70 | 99.8 | N4 black | 350–370 |
| Example 6 | 70 | 0.26 | 0.79 | 0.72 | 99.7 | N4 black | 350–370 |
| Example 7 | 80 | 0.23 | 0.74 | 0.68 | 99.8 | N4 black | 350–370 |
| Example 8 | 80 | 0.44 | 0.84 | 0.72 | 99.7 | N4 black | 350–370 |
| Example 9 | 70 | 0.37 | 0.8 | 0.76 | 99.7 | N4 black | 350–370 |

TABLE 3

|  | Y content as $Y_2O_3$ (wt %) | Maximum temperature in firing (° C.) | Retention time at maximum temperature (hour) | Average grain size (μm) | Spin amount (spin/mg) | g-value | Volume resistivity (Ω · m) at 100° C. | at 500° C. |
| --- | --- | --- | --- | --- | --- | --- | --- | --- |
| Comparative Example 1 | 0 | 1750 | 4 | 2.3 | 7.0E + 11 | 2.0005 | 7.8E + 14 | 1.0E + 8 |
| Comparative Example 2 | 0 | 1800 | 4 | 2.6 | 9.2E + 11 | 2.0001 | 1.5E + 14 | 8.5E + 6 |
| Comparative Example 3 | 0 | 1850 | 4 | 3.8 | 5.8E + 12 | 1.9979 | 5.2E + 11 | 2.1E + 6 |
| Comparative Example 4 | 0 | 1900 | 4 | 6.3 | 5.9E + 12 | 1.9975 | 1.6E + 10 | 1.1E + 6 |
| Comparative Example 5 | 0.1 | 1850 | 5 | 6.0 | 1.9E + 13 | 1.9976 | 1.1E + 9 | <1E + 6 |
| Comparative Example 6 | 0.1 | 1900 | 5 | 7.0 | 2.0E + 13 | 1.9977 | 5.5E + 7 | <1E + 6 |
| Comparative Example 7 | 0.3 | 1900 | 5 | 7.0 | 2.3E + 13 | 1.9975 | 1.8E + 8 | <E + 6 |
| Comparative Example 8 | 1 | 1850 | 4 | 6.8 | 1.0E + 13 | 1.998 | 3.8E + 10 | 2.5E + 6 |
| Comparative Example 9 | 3 | 1850 | 4 | 8.5 | 1.2E + 12 | 1.9992 | 4.8E + 11 | 8.5E + 6 |
| Comparative Example 10 | 5 | 1950 | 5 | 10.0 | 6.0E + 12 | 2.001 | 9.1E + 10 | 1.5E + 6 |

TABLE 4

|  | Amount of metal impurities (ppm) | Y content (wt %) | O content (wt %) | Difference between total O content and O content as $Y_2O_3$ (wt %) | Relative density (%) | Lightness and chromaticness | Main peak in cathode luminescence spectrum (nm) |
| --- | --- | --- | --- | --- | --- | --- | --- |
| Comparative Example 1 | 80 | 0 | 0.73 | 0.73 | 99.0 | N4 black | 350–370 |
| Comparative Example 2 | 70 | 0 | 0.72 | 0.72 | 99.2 | N4 black | 350–370 |
| Comparative Example 3 | 70 | 0 | 0.72 | 0.72 | 99.5 | N6 gray | 350–370 |
| Comparative Example 4 | 70 | 0 | 0.7 | 0.70 | 99.7 | amber | 350–370 |
| Comparative Example 5 | 80 | 0.063 | 0.64 | 0.62 | 99.7 | amber | 350–370 |
| Comparative Example 6 | 80 | 0.061 | 0.65 | 0.63 | 99.7 | amber | 350–370 |
| Comparative Example 7 | 80 | 0.19 | 0.68 | 0.63 | 99.7 | amber | 350–370 |
| Comparative Example 8 | 70 | 0.79 | 1 | 0.79 | 99.0 | N5.5 gray | — |
| Comparative Example 9 | 70 | 2.01 | 0.95 | 0.41 | 99.0 | N6 gray | 600 |
| Comparative Example 10 | 90 | 0.11 | 0.25 | 0.22 | 98.5 | amber | 600 |

As seen from the results of Tables 3 and 4, in Comparative Examples 1 and 2, each sintered body does not contain yttria, and has an average grain size of less than 3 μm and a spin amount of not more than $10^{12}$ spins/mg, so that the volume resistivity at 100° C. is too high. In Comparative Examples 3 and 4, the grains are grown to an average grain size of not less than 3.8 μm by making the sintering temperature higher than that in Comparative Examples 1 and 2. In this case, the spin amount increases and particularly the volume resistivity becomes extremely low at a high temperature.

In Comparative Examples 5, 6 and 7, the average grain size of the grains is large and the grain growth fairly proceeds and also the spin amount becomes large. These sintered bodies are peculiar materials indicating a very low volume resistivity at 100° C., which tends to remarkably decrease the volume resistivity at a high temperature range of not less than 500° C. In these examples, it is also noticed that the g-value lowers.

In Comparative Examples 8, 9 and 10, the volume resistivity is observed to decrease at a high temperature range mainly because of the grain growth.

On the other hand, as seen from Tables I and 2, when the content of yttria, average grain size and spin amount satisfy the conditions defined in the invention, the volume resistivities at 100° C. and 500° C. exist within a relatively narrow range. These sintered bodies correspond to those at a stage of stopping the sintering before the grain growth through the progressing of the sintering sufficiently proceeds in the material system as shown in Comparative Examples 5–7, and hence they are considered to develop a peculiar property being a linear volume resistivity.

As mentioned above, the invention provides a novel aluminum nitride sintered body being less in the change of volume resistivity over a temperature range wider than that of the conventional one.

What is claimed is:

1. An aluminum nitride sintered body comprising aluminum nitride crystal grains and a rare earth element (a conversion content as an oxide thereof) present in an amount of 0.05–0.5% by weight, wherein said aluminum nitride sintered body has an average grain size of not more than 3 μm, a spin amount per unit mg of aluminum obtained from a spectrum as measured by an electron spin resonance method of not more than $5 \times 10^{12}$ spins/mg, and a content of metal impurities other than the rare earth element in the aluminum nitride sintered body not exceeding 500 ppm.

2. An aluminum nitride sintered body according to claim 1, which has volume resistivities between 100° C. and 500° C. within a range of $1 \times 10^{14}$–$1 \times 10^7$ Ω·cm.

3. An aluminum nitride sintered body according to claim 2, which has volume resistivities between 100° C. and 500° C. within a range of $5 \times 10^{13}$–$1 \times 10^8$ Ω·cm.

4. An aluminum nitride sintered body according to claim 1, which has g-value of unpaired electron of aluminum obtained from the spectrum as measured by the electron spin resonance method of not less than 2.0001 but not more than 2.0009.

5. An aluminum nitride sintered body according to claim 1, which has a difference between a total oxygen content in the aluminum nitride sintered body and a conversion oxygen content of the rare earth element converted to an oxide thereof of not more than 1.0% by weight.

6. An aluminum nitride sintered body according to claim 1, wherein the aluminum nitride sintered body has a main peak of a spectrum obtained by a cathode luminescence within a range of 350–370 nm.

7. An aluminum nitride sintered body according to claim 1, which has lightness defined in JIS Z 8721 of not more than N4.

8. An electronic functional material comprising a substrate made of an aluminum nitride sintered body as claimed in claim 1.

9. An electrostatic chuck provided with an attracting surface for attracting and holding a semiconductor wafer, which comprises a substrate made of an aluminum nitride sintered body as claimed in claim 1, a planar electrode embedded in the substrate, and a power source for supplying a direct current power to the planar electrode.

\* \* \* \* \*